United States Patent [19]

Yokoyama

[11] Patent Number: 5,712,595
[45] Date of Patent: Jan. 27, 1998

[54] APPARATUS AND METHOD OF SETTING VARIABLE DIVIDING RATIO AND APPARATUS USING THE SAME

[75] Inventor: Hiroshi Yokoyama, Kanagawa, Japan

[73] Assignee: Sony Corporation, Tokyo, Japan

[21] Appl. No.: 611,900

[22] Filed: Mar. 6, 1996

[30] Foreign Application Priority Data

Mar. 7, 1995 [JP] Japan .................. 7-074391

[51] Int. Cl.$^6$ .................. H03K 23/66; H03L 7/18
[52] U.S. Cl. .................. 331/2; 331/25; 375/376; 377/52; 455/76; 455/183.2; 455/260
[58] Field of Search .................. 331/2, 25; 375/376; 377/52; 455/76, 183.2, 260

[56] References Cited

U.S. PATENT DOCUMENTS

| | | | |
|---|---|---|---|
| 4,184,068 | 1/1980 | Washburn | 331/25 |
| 4,321,555 | 3/1982 | Howk et al. | 331/25 |
| 5,045,813 | 9/1991 | Yamashita et al. | 331/25 |

FOREIGN PATENT DOCUMENTS 2239115  6/1991  United Kingdom.

*Primary Examiner*—Siegfried H. Grimm
*Attorney, Agent, or Firm*—Jay H. Maioli

[57] ABSTRACT

A counter apparatus for setting a dividing ratio given as a sum of a fixed value and a variable value, including an upper-digits-setting circuit for setting upper digits of a series of digits representing the dividing ratio to upper predetermined digits, the upper digits being fixed digits composing upper digits of a series of digits representing the fixed value; an adder for adding fixed digits composing middle digits of the series of digits representing the fixed value and variable digits composing upper digits of a series of digits representing the variable value and providing an output thereof as middle digits of the series of digits representing the dividing ratio which are variable digits; a middle-digits-setting circuit for setting the middle digits of the series of digits representing the dividing ratio to middle predetermined digits; and a lower-digits-setting circuit for setting lower digits of the series of digits representing the dividing ratio to lower predetermined digits, the lower digits being variable digits composing lower digits of the series of digits representing the variable value.

18 Claims, 8 Drawing Sheets

FIG.6A when CHNO = 1 (first channel)

Base unit transmission
(portable unit receiving)
```
  1 1 1 0 1 1 0 1 1 0 1 0 0 0 0      (=76D0(hex))
+             0 0 0 0 0 0 1          (=1)
  ─────────────────────────────
  1 1 1 0 1 1 0 1 1 0 1 0 0 0 1      (=76D1(hex))
  _____/ _____/ \_____/
   b15~b10   b9~b5    b4~b1
```

FIG.6B when CHNO = 89 (eighty-ninth channel)

Base unit transmission
(portable unit receiving)
```
  1 1 1 0 1 1 0 1 1 0 1 0 0 0 0      (=76D0(hex))
+             1 0 1 1 0 0 1          (=59(hex)=89)
  ─────────────────────────────
  1 1 1 0 1 1 1 0 0 1 0 1 0 0 1      (=7729(hex))
  _____/ _____/ \_____/
   b15~b10   b9~b5    b4~b1
```

FIG.6C when CHNO = 1 (first channel)

Portable unit transmission
(base unit receiving)
```
  1 0 0 1 1 1 1 0 1 0 1 0 1 0 0      (=4F54(hex))
+             0 0 0 0 0 0 1          (=1)
  ─────────────────────────────
  1 0 0 1 1 1 1 0 1 0 1 0 1 0 1      (=4F55(hex))
  _____/ _____/ \___/
    b15~b9      b8~b3    b2,b1
```

FIG.6D when CHNO = 89 (eighty-ninth channel)

Portable unit transmission
(base unit receiving)
```
  1 0 0 1 1 1 1 0 1 0 1 0 1 0 0      (=4F54(hex))
+             1 0 1 1 0 0 1          (=59(hex)=89)
  ─────────────────────────────
  1 0 0 1 1 1 1 1 0 1 0 1 1 0 1      (=4FAD(hex))
  _____/ _____/ \___/
    b15~b9      b8~b3    b2,b1
```

FIG.6C' when CHNO = 1 (first channel)

Portable unit transmission (base unit receiving)

```
  1 0 0 1 1 1 1 0 1 0 1 0 1 0 0     (=4F54(hex))
+               0 0 0 0 0 0 1       (=1)
  ─────────────────────────────
  1 0 0 1 1 1 1 0 1 0 1 0 1 0 1     (=4F55(hex))
  _____/ _____/ \_____/
     b15~b9       b8~b5    b4~b1
```

FIG.6D' when CHNO = 89 (eighty-ninth channel)

Portable unit transmission (base unit receiving)

```
  1 0 0 1 1 1 1 0 1 0 1 0 1 0 0     (=4F54(hex))
+               1 0 1 1 0 0 1       (=59(hex)=89)
  ─────────────────────────────
  1 0 0 1 1 1 1 1 0 1 0 1 1 0 1     (=4FAD(hex))
  _____/ _____/ \_____/
     b15~b9       b8~b5    b4~b1
```

FIG. 7A

| channel number CHNO | (portable unit receiving frequency) base unit transmission frequency $f_{BU}$ (MHz) | (base unit receiving frequency) portable unit transmission frequency $f_{HS}$ (MHz) |
|---|---|---|
| 1 | 380.2125 | 253.8625 |
| 2 | 380.2250 | 253.8750 |
| 3 | 380.2375 | 253.8875 |
| ... | ... | ... |
| 89 | 381.3125 | 254.9625 |

FIG. 7B

| channel number CHNO | base unit transmission side dividing ratio (portable unit receiving side dividing ratio) $N_{BU}$ | portable unit transmission side dividing ratio (base unit receiving side dividing ratio) $N_{HS}$ |
|---|---|---|
| 1 | 30417 | 20309 |
| 2 | 30418 | 20310 |
| 3 | 30419 | 20311 |
| ... | ... | ... |
| 89 | 30505 | 20397 |

APPARATUS AND METHOD OF SETTING VARIABLE DIVIDING RATIO AND APPARATUS USING THE SAME

BACKGROUND OF THE INVENTION

The present invention relates to a dividing ratio setting circuit for a Phase-Locked Loop (hereinafter referred to as "PLL") and a wireless apparatus using this dividing ratio setting circuit for a PLL.

For example, a frequency band of 89 channels is allotted for low power-type cordless telephone use in Japan. The relationship between their channel numbers CHNO and base unit and portable unit transmission frequencies fBU and fHS is shown in FIG. 7A. The inter-channel frequency spacings at this time are then all fixed at 12.5 kHz.

Transmission signals of these kinds of frequencies are generally formed using a PLL. However, when a carrier signal of the same frequency as the transmission frequencies fBS and fHS is formed directly at the PLL, the reference frequency necessary for the PLL is taken to be the frequency 12.5 kHz, which is equal to the channel spacing frequency interval.

Further, if:

NBU=dividing ratio (integer) of the variable dividing circuit of the PLL for the base unit transmitter, and NHS=dividing ratio (integer) of the variable dividing circuit of the PLL for the base unit transmitter, then $$fBU[MHz]=12.5[kHz]\times NBU$$

$$fHS[MHz]=12.5[kHz]\times NHS.$$

The relationship between the channel number CHNO and the dividing ratios NBU and NHS is as shown in FIG. 7B.

With a base unit or portable unit, when the channel is set-up, data for the dividing ratio NBU or NHS corresponding to the channel number CHNO is formed at the microcomputer, with this data then being provided to the variable dividing circuit of the PLL using serial or parallel communications.

However, the amount of microcomputer software for system control use expands dramatically as cordless telephones become more highly functional. Also, with cordless telephones, a PLL for forming a local oscillating signal is also provided at the receiving circuit and it is necessary to set this local oscillating frequency. It is therefore desirable for the PLL interface to be made simple, fast and intelligent.

PLLs have been considered where a decoder is built-in, numeric data has been externally inputted, this numeric data has been decoded into a dividing ratio NBU or NHS and this has been set at the variable dividing circuit.

However, this kind of PLL is effective when the channel number is small but in the case of PLL used in equipment such as cordless telephones where the channel number is large, the scale of the decoder becomes larger and the PLL becomes more expensive.

Therefore, with cordless telephones, general purpose PLLs have to be used with resultant increase of the load on the microcomputer and the software.

The present invention sets out to resolve the aforementioned problems.

SUMMARY OF THE INVENTION

In order to solve the aforementioned problems, according to the present invention, a counter apparatus for setting a dividing ratio given as a sum of a fixed value and a variable value comprises:

an upper-digits-setting circuit for setting upper digits of a series of digits representing said dividing ratio to upper predetermined digits, the upper digits being fixed digits composing upper digits of a series of digits representing the fixed value;

an adder for adding fixed digits composing middle digits of the series of digits representing the fixed value and variable digits composing upper digits of a series digits representing the variable value and providing an output thereof as middle digits of the series of digits representing the dividing ratio which are variable digits;

a middle-digits-setting circuit for setting the middle digits of the series of digits representing the dividing ratio to middle predetermined digits; and a lower-digits-setting circuit for setting lower digits of the series of digits representing the dividing ratio to lower predetermined digits, the lower digits being variable digits composing lower digits of the series of digits representing the variable value.

The counter apparatus further comprises:

a counter for setting the upper and middle predetermined digits thereto; and a counter for setting the lower predetermined digits thereto.

Or, the counter apparatus may further comprise:

a counter for setting the upper predetermined digits and a part of the middle predetermined digits thereto; and a counter for setting the remaining part of the middle predetermined digits and the lower predetermined digits thereto.

In the above counter apparatus, the counter for setting the lower predetermined digits thereto or the counter for setting the remaining part of the middle predetermined digits and the lower predetermined digits thereto may be a swallow counter.

Further, according to the present invention, a method of setting a dividing ratio given as a sum of a fixed value and a variable value to a counter comprises the steps of:

setting upper digits of a series of digits representing the dividing ratio to upper predetermined digits, the upper digits being fixed digits composing upper digits of the series of digits representing the fixed value;

setting a sum of fixed digits composing middle digits of the series of digits representing the fixed value and variable digits composing upper digits of a series of digits representing the variable value to middle predetermined digits; and setting lower digits of the series of digits representing the dividing ratio to lower predetermined digits, the lower digits being variable digits composing lower digits of the series of digits representing the variable value.

Moreover, according to the present invention, a phase-locked-loop oscillating circuit comprises:

an oscillator for generating an oscillated signal;

a variable divider for dividing a frequency of the oscillated signal by a variable dividing ratio which is given as a sum of a fixed value and a variable value; and a comparator for comparing an output signal of the variable divider with a reference oscillated signal having a reference frequency and controlling the frequency of the oscillated signal so that the frequency of the output signal of the variable divider becomes equal to the reference frequency.

The above variable divider in the phase-locked-loop oscillating circuit comprises:

a memory for memorizing the variable value as data for varying frequency of oscillation;

an upper-digits-setting circuit for setting upper digits of a series of digits representing the variable dividing ratio to upper predetermined digits, the upper digits being fixed digits composing upper digits of a series of digits representing the fixed value;

an adder for adding fixed digits composing middle digits of the series of digits representing the fixed value and variable digits composing upper digits of a series digits representing the variable value and providing an output thereof as middle digits of the series of digits representing the variable dividing ratio which are variable digits;

a middle-digits-setting circuit for setting the middle digits of the series of digits representing the dividing ratio to middle predetermined digits; and a lower-digits-setting circuit for setting lower digits of the series of digits representing the dividing ratio to lower predetermined digits, the lower digits being variable digits composing lower digits of the series of digits representing the variable value.

Still further, according to the present invention, a receiver apparatus comprises:

a phase-locked-loop oscillating circuit; and a frequency converting circuit for converting frequencies of inputted signals by mixing with an output signal of the phase-locked-loop oscillating circuit provided as a local oscillator.

Above phase-locked-loop oscillating circuit in the receiver apparatus comprises:

an oscillator for generating an oscillated signal;

a variable divider for dividing a frequency of the oscillated signal by a variable dividing ratio which is given as a sum of a fixed value and a variable value; and a comparator for comparing an output signal of the variable divider with a reference oscillated signal having a reference frequency and controlling the frequency of the oscillated signal so that the frequency of the output signal of the variable divider becomes equal to the reference frequency.

The variable divider comprises:

a memory for memorizing the variable value as data for varying frequency of oscillation;

an upper-digits-setting circuit for setting upper digits of a series of digits representing the variable dividing ratio to upper predetermined digits, the upper digits being fixed digits composing upper digits of a series of digits representing the fixed value;

an adder for adding fixed digits composing middle digits of the series of digits representing the fixed value and variable digits composing upper digits of a series digits representing the variable value and providing an output thereof as middle digits of the series of digits representing the variable dividing ratio which are variable digits;

a middle-digits-setting circuit for setting the middle digits of the series of digits representing the dividing ratio to middle predetermined digits; and a lower-digits-setting circuit for setting lower digits of the series of digits representing the dividing ratio to lower predetermined digits, the lower digits being variable digits composing lower digits of the series of digits representing the variable value.

Still further, according to the present invention, a transmitter apparatus comprises:

a phase-locked-loop oscillating circuit; and an amplifier for amplifying an output signal of the phase-locked-loop oscillating circuit.

Above phase-locked-loop oscillating circuit in the transmitter apparatus comprises:

an oscillator for generating an oscillated signal;

a variable divider for dividing a frequency of the oscillated signal by a variable dividing ratio which is given as a sum of a fixed value and a variable value; and a comparator for comparing an output signal of the variable divider with a reference oscillated signal having a reference frequency and controlling the frequency of the oscillated signal so that the frequency of the output signal of the variable divider becomes equal to the reference frequency.

The variable divider in the phase-locked-loop oscillating circuit in the transmitter apparatus comprises:

a memory for memorizing the variable value as data for varying frequency of oscillation;

an upper-digits-setting circuit for setting upper digits of a series of digits representing the variable dividing ratio to upper predetermined digits, the upper digits being fixed digits composing upper digits of a series of digits representing the fixed value;

an adder for adding fixed digits composing middle digits of the series of digits representing the fixed value and variable digits composing upper digits of a series digits representing the variable value and providing an output thereof as middle digits of the series of digits representing the variable dividing ratio which are variable digits;

a middle-digits-setting circuit for setting the middle digits of said series of digits representing the dividing ratio to middle predetermined digits; and a lower-digits-setting circuit for setting lower digits of said series of digits representing the dividing ratio to lower predetermined digits, the lower digits being variable digits composing lower digits of the series of digits representing the variable value.

Moreover, according to the present invention, a transceiver apparatus comprising:

a first phase-locked-loop oscillating circuit; and a second phase-locked-loop oscillating circuit.

The first phase-locked-loop oscillating circuit comprises:

a first oscillator for generating a first oscillated signal;

a first variable divider for dividing a frequency of the first oscillated signal by a first variable dividing ratio which is given as a sum of a first fixed value and a first variable value; and a first comparator for comparing an output signal of the first variable divider with a reference oscillated signal having a reference frequency and controlling the frequency of the first oscillated signal so that the frequency of the output signal of the first variable divider becomes equal to the reference frequency.

The first variable divider comprises:

a first memory for memorizing the first variable value as data for varying frequency of oscillation;

a first upper-digits-setting circuit for setting upper digits of a series of digits representing the first variable dividing ratio to upper predetermined digits, the upper digits being fixed digits composing upper digits of a series of digits representing the first fixed value;

a first adder for adding fixed digits composing middle digits of the series of digits representing the first fixed value and variable digits composing upper digits of a series of digits representing the first variable value and providing an output thereof as middle digits of the series of digits representing the first variable dividing ratio which are variable digits;

a first middle-digits-setting circuit for setting the middle digits of the series of digits representing the first dividing ratio to middle predetermined digits; and a first lower-digits-setting circuit for setting lower digits of the series of digits representing the first dividing ratio to lower predetermined digits, the lower digits being variable digits composing lower digits of the series of digits representing the first variable value.

In addition, the second phase-locked-loop oscillating circuit comprises:

a second oscillator for generating a second oscillated signal;

a second variable divider for dividing a frequency of the second oscillated signal by a second variable dividing ratio which is given as a sum of a second fixed value and a second variable value; and a second comparator for comparing an output signal of the second variable divider with a reference oscillated signal having a reference frequency and controlling the frequency of the second oscillated signal so that the frequency of the output signal of the second variable divider becomes equal to the reference frequency.

The second variable divider comprises:

a second memory for memorizing the second variable value as data for varying frequency of oscillation;

a second upper-digits-setting circuit for setting upper digits of a series of digits representing the second variable dividing ratio to upper predetermined digits, the upper digits being fixed digits composing upper digits of a series of digits representing the second fixed value;

a second adder for adding fixed digits composing middle digits of the series of digits representing the second fixed value and variable digits composing upper digits of a series of digits representing the second variable value and providing an output thereof as middle digits of the series of digits representing the second variable dividing ratio which are variable digits;

a second middle-digits-setting circuit for setting the middle digits of the series of digits representing the second dividing ratio to middle predetermined digits; and a second lower-digits-setting circuit for setting lower digits of the series of digits representing the second dividing ratio to lower predetermined digits, the lower digits being variable digits composing lower digits of the series of digits representing the second variable value.

In the transceiver apparatus, each of the first and second phase-locked-loop oscillating circuits further comprises:

a counter for setting the upper and middle predetermined digits thereto; and a counter for setting the lower predetermined digits thereto.

Or, each of the first and second phase-locked-loop oscillating circuits may further comprise:

a counter for setting the upper predetermined digits and a part of the middle predetermined digits thereto; and a counter for setting the remaining part of said middle predetermined digit sand said lower predetermined digits thereto.

In each of the above first and second phase-locked-loop oscillating circuits, the counter for setting the lower predetermined digits thereto or the counter for setting the remaining part of the middle predetermined digits and the lower predetermined digits thereto may be a swallow counter.

Furthermore, in the above transceiver apparatus, the number of digits of each of the counters for setting the upper and middle predetermined digits thereto is equal in the first and second phase-locked-loop oscillating circuits, and the number of digits of each of the counters for setting the upper and a part of the middle predetermined digits thereto is equal in the first and second phase-locked-loop oscillating circuits.

Moreover, the number of digits of each of the swallow counters is equal in the first and second phase-locked-loop oscillating circuits.

BRIEF DESCRIPTION OF THE DRAWINGS

FIG. 6A, FIG. 6B, FIG. 6C, FIG. 6D, FIG. 6C' and FIG. 6D' show relationships between channel numbers and dividing ratios for the receiving and transmitting operations of base and portable units; and FIG. 7A and FIG. 7B are tables showing the relationship between the channel numbers, transmission frequencies and dividing ratios of the base and portable stations.

DETAILED DESCRIPTION OF THE PREFERRED EMBODIMENTS

First Embodiment

Example of a cordless telephone

Figure 1:
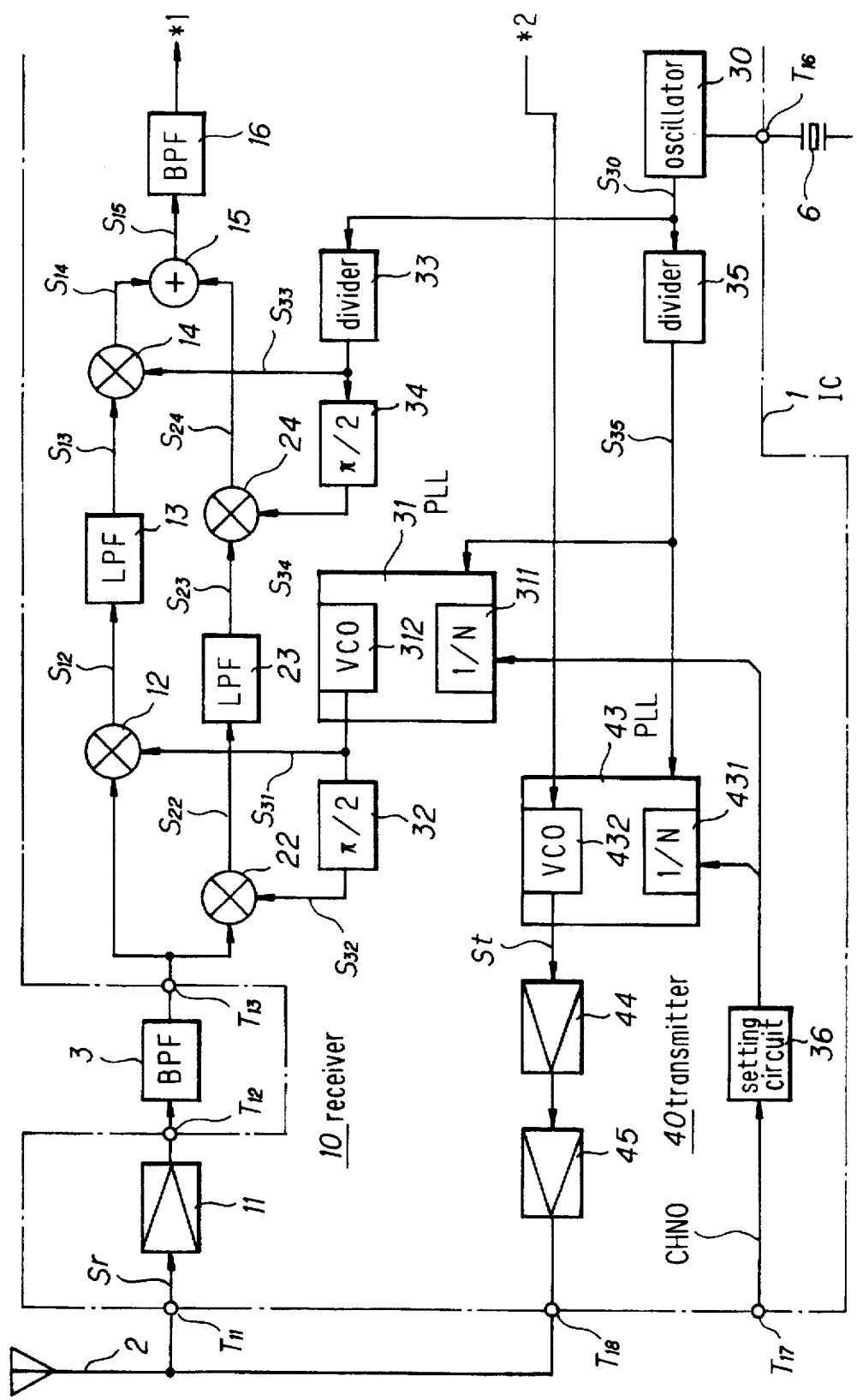
FIG. 1 is a block diagram showing the structure of part of an embodiment of the present invention.

First, an example of the receiving circuit and transmitter for the cordless telephone of this invention will be described using FIG. 1 and FIG. 2. In this example, the whole of the receiving circuit and transmitter is incorporated on a single IC chip and the case is shown where this IC is used in a portable unit. Further, *1 and *2 of FIG. 1, and *1 and *2 of FIG. 2 are connected together and the portion surrounded by the dotted-and-dashed line is incorporated on a single chip.

The IC 1 has a receiver 10 and a transmitter 40. The receiver 10 has a direct conversion-type structure employing a double super-heterodyning method, i.e. a down channel FM signal from the base unit is received as a received signal Sr by antenna 2 and then provided from a terminal T11 to a high frequency amplifier 11, on to a terminal T12, then to a band pass filter 3 that allows all of the down channels to pass and then finally via terminal T13 on to first mixers 12 and 22 for performing an orthogonal transformation to an I axis and a Q axis.

Further, an oscillating circuit 30 is provided. This oscillating circuit 30 generates a stabilized reference frequency such as an oscillating frequency of, for example, 14.4 MHz. A crystal oscillating element 6 is therefore connected to the oscillating circuit 30 via the terminal T16 to form the oscillating circuit as a crystal oscillating circuit.

The oscillated signal S30 of this oscillating circuit 30 is then provided to a dividing circuit 35 and divided to be the signal having a frequency of $1/1152$, i.e. the signal S35 of channel spacing frequency 12.5 kHz. This signal is then provided to a PLL 31 as a reference frequency signal.

A dividing ratio setting circuit 36 is also provided. This dividing ratio setting circuit 36 is supplied with data for a channel number CHNO via terminal T17, with dividing ratio data being formed from this data. This dividing ratio setting circuit 36 is described in detail later.

Dividing ratio data corresponding to the channel number CHNO from the dividing ratio setting circuit 36 is provided to a variable dividing circuit 311 of the PLL 31 to set the divided frequency. In this way, an oscillated signal S31 of the same frequency as the carrier frequency for the received signal Sr as an FM Signal is taken from a voltage controlled oscillator (hereinafter referred to as a "VCO") 312 of the PLL 31.

In this case, the carrier frequency of the received signal Sr as the FM signal is equal to the transmission frequency fBU of the base station, therefore, the frequency of the oscillated signal S31 has also the value fBU.

This oscillated signal S31 is provided to the first mixer 12 as a first locally oscillated signal. The oscillated signal S31 is also provided to a phase-shifting circuit 32 and phase-shifted by $\pi/2$, and the phase-shifted signal S32 is provided to the first mixer 22 as the first oscillated signal.

Figure 3A:
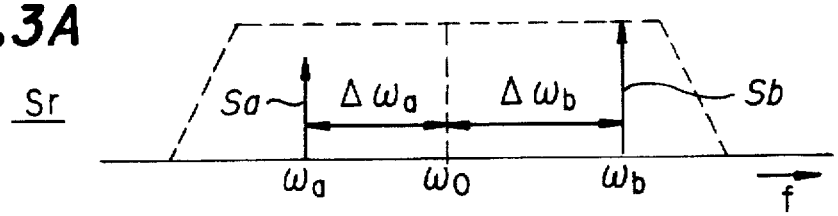
FIG. 3A and FIG. 3B are graphs of frequency spectrums illustrating this invention.

Therefore, for simplicity, as shown in FIG. 3A, the received signal Sr has a signal component Sa within the lower sideband and a signal component Sb within the upper sideband. Further, if:

$\omega_0$ = the carrier frequency (angular frequency) of the received signal Sr,
$\omega_0 = 2\pi fBU$,
$\omega_a$ = angular frequency of signal component Sa ($\omega_a < \omega_0$),
Ea = amplitude of signal component Sa,
$\omega_b$ = angular frequency of signal component Sb ($\omega_b > \omega_0$),
Eb = amplitude of signal component Sb, and
$\Delta\omega_a = \omega_0 - \omega_a$
$\Delta\omega_b = \omega_b - \omega_0$,
then,
Sr = Sa + Sb
Sa = Ea · sin$\omega_a$t
Sb + Eb · sin$\omega_b$t.
   Sb + Eb.sin$\omega_b$t.
Further, if:
E1 = the amplitude of the oscillated signal S31 and the phase-shifted signal S32 as the first locally oscillated signals,
then
S31 = E1.sin$\omega_0$t
S32 = E1.cos$\omega_0$t.
Therefore, if:
S12 = output signal of the first mixer 12, and
S22 = output signal of the first mixer 22,
then,
S12 = Sr.S31
   = (Ea.sin$\omega_a$t + Eb.sin$\omega_b$t) × E1.sin$\omega_0$t
   = $\alpha$a{−cos($\omega_a + \omega_0$)t + cos($\omega_0 − \omega_a$)t}
   + $\alpha$b{−cos($\omega_b + \omega_0$)t + cos($\omega_b − \omega_0$)t}
   = $\alpha$a{−cos($\omega_b + \omega_0$)t+cos$\Delta\omega_b$t}
S22 = Sr.S32
   = (Ea.sin$\omega_a$t + Eb.sin$\omega_b$t) × E1.cos$\omega_0$t
   = $\alpha$a{sin($\omega_a + \omega_0$)t − sin($\omega_0 − \omega_a$)t}
   $\alpha$b{sin($\omega_b + \omega_0$)t + sin($\omega_b − \omega_0$)t}

= $\alpha$a{sin($\omega_a + \omega_0$)t − sin$\Delta\omega_a$t}
   + $\alpha$b{sin($\omega_b + \omega_0$)t + sin$\Delta\omega_b$t}
   $\alpha$a = Ea.E1/2
   $\alpha$b = Eb.E1/2.

Of the above equations, the signal components for the angular frequencies $\Delta\omega_a$ and $\Delta\omega_b$ are the necessary intermediate frequency signals. Then, these output signals S12 and S22 are provided to the low-pass filters 13 and 23, with the signal components for the angular frequencies $\Delta\omega_a$ and $\Delta\omega_b$ being extracted as the first intermediate frequency signals S13 and S23 and being taken to be:

S13=$\alpha$a· cos $\Delta\omega_a$t+$\alpha$b· cos $\Delta\omega_b$t

S23=−$\alpha$a· sin $\Delta\omega_a$t+$\alpha$b· sin $\Delta\omega_b$t.

In this case, as becomes clear from the above equations and FIG. 3A, the first intermediate frequency signals S13 and S23 are baseband signals.

These first intermediate frequency signals S13 and S23 are provided to the second mixers 14 and 24 for I axis and Q axis of the orthogonal transformations.

The oscillated signal S30 from the oscillating circuit 30 is provided to a dividing circuit 33 and divided into a comparatively low frequency signal S33, for example, a signal having a frequency divided by 262 to be about 55 kHz. This low frequency signal S33 is then provided to the second mixer 14 as the second locally oscillated signal and provided to the phase shifting circuit 34 and phase shifted by $\pi/2$, with this phase-shifted signal S34 being provided to the second mixer 24 as the second locally oscillated signal.

Therefore, if:

S33 = E2 · sin$\omega_s$t
S34 = E2 · cos$\omega_s$t,
E2 = amplitude of the signal S33 and the phase-shifted signal S34 as the second locally oscillated signals,
$\omega_s = 2\pi$fs
(fs = approximately 55 kHz),
and if:
S14 = output signal for the second mixer 14, and
S24 = output signal for the second mixer 24,
then,
S14 = S13 · S33
   = ($\alpha$a · cos$\Delta\omega_a$t + $\alpha$b · cos$\Delta\omega_b$t) × E2 · sin$\omega_s$t
   = $\beta$a{sin($\Delta\omega_a + \omega_s$)t − sin($\Delta\omega_a − \omega_s$)t} +
   $\beta$b{sin($\Delta\omega_b + \omega_s$)t − sin($\Delta\omega_b − \omega_s$)t}
S24 = S23 · S34
   = (−$\alpha$a · sin$\Delta\omega_a$t + $\alpha$b · sin$\Delta\omega_b$t) × E2 · cos$\omega_s$t
   = −$\beta$a{sin($\Delta\omega_a + \omega_s$)t + sin($\Delta\omega_a − \omega_s$)t} +
   $\beta$b{sin($\Delta\omega_b + \omega_s$)t + sin($\Delta\omega_b − \omega_s$)t}
   $\beta$a = $\alpha$a · E2/2
   $\beta$b = $\alpha$b · E2/2.

Then, at these output signals S14 and S24, upon transforming the output signals S14 and S24 so that the value for the frequency difference does not become negative, S14 = $\beta$a{sin($\Delta\omega_a + \omega_s$)t + sin($\omega_s − \Delta\omega_a$)t} +
$\beta$b{sin($\Delta\omega_b + \omega_s$)t + sin($\omega_s − \Delta\omega_b$)t}
= $\beta$a · sin($\omega_s + \Delta\omega_a$)t + $\beta$a · sin($\omega_s − \Delta\omega_a$)t +
$\beta$b · sin($\omega_s + \Delta\omega_b$)t + $\beta$b · sin($\omega_s − \Delta\omega_b$)t
S24 = −$\beta$a{sin($\Delta\omega_a + \omega_s$)t − sin($\omega_s − \Delta\omega_a$)t} +
$\beta$b{sin($\Delta\omega_b + \omega_s$)t − sin($\omega_s − \Delta\omega_b$)t}
= −$\beta$a · sin($\omega_s + \Delta\omega_a$)t + $\beta$a · sin($\omega_s − \Delta\omega_a$)t +
$\beta$b · sin($\omega_s + \Delta\omega_b$)t − $\beta$b · sin($\omega_s − \Delta\omega_b$)t.

These output signals S14 and S24 are then provided to an adding circuit 15 and added, with an addition signal S15 expressed by $$S15=S14+S24=2\beta a \cdot \sin(\omega_s-\Delta\omega a)t+2\beta b \cdot \sin(\omega_s+\Delta\omega b)t$$

and then extracted from the adding circuit 15.

Figure 3B:
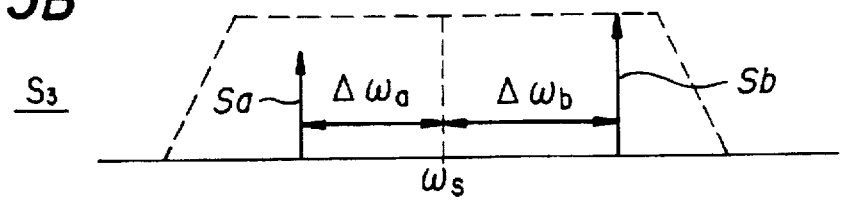

The addition signal S15 expressed in diagrammatic form will be as shown in FIG. 3B. This addition signal S15 is the signal at the time of frequency conversion of the received signal Sr to a signal of frequency (angular frequency) $\omega_s$ which is the carrier frequency, i.e. the addition signal S15 is the second intermediate frequency signal for the intermediate frequency fs.

The addition signal S15 as the second intermediate frequency signal is provided to the FM demodulating circuit 18 via a band-pass filter 16 for intermediate frequency filter use and a limiter amplifier 17 and is then demodulated to the original audio signal. This audio signal is then provided to a speaker 4 of a telephone receiver via an amplifier 19 and a terminal T14.

The above is the structure and operation of the receiver 10.

On the other hand, the transmitter 40 takes audio signals directly as up-channel FM signals and is provided with a PLL 43. A divided signal S35 from a dividing circuit 35 is then provided at this PLL 43 as a reference frequency signal. Further, data for the dividing ratio corresponding to the channel number CHNO is taken from the dividing ratio setting circuit 36. This data is provided to a variable dividing circuit 431 of the PLL 43 to set the divided frequency.

An oscillated signal St of the carrier frequency fHS for the up channel that forms a pair with the down channel received by the receiver 10 is taken from a VCO 432 of the PLL 43.

Audio signals from a microphone 5 for telephone use are provided to a low-pass filter 42 via a terminal T15 and an amplifier 41 and unnecessary band components are then removed before this signal is provided to the VCO 432 of PLL 43 as an oscillating frequency control signal.

In this way, the oscillated signal St taken from the VCO 432 is an FM signal which is the up channel that makes a pair with the down channel received at the receiver 10 and is FM-modulated by the audio signal from the low-pass filter 42.

This oscillated signal St as an FM signal is then taken from a terminal T18 via a drive amplifier 44 and an output amplifier 45 and is sent to the antenna 2.

The above is a description of the structure and operation of the transmitter 40.

If the FM receiver is a usual FM receiver, the intermediate frequency will be 10.7 MHz, the intermediate filter needs to constructed from a ceramic filter and it will therefore not be possible to put this filter into an integrated circuit.

However, with the above receiver 10, the output signals S12 and S22 as the first intermediate frequency signals are baseband frequency signals and the second intermediate frequency fs is as low as, for example, 55 kHz. The low-pass filters 13 and 23 and the band-pass filter 16 may therefore be constructed as active filters having resistors, capacitors and amplifiers. The receiver 10 may therefore be put into an IC with the exception of the band-pass filter 3 and the oscillating coil for the VCO 312 (not shown in the drawings). The transmitter 40 can be put into an IC in the same manner.

Figure 2:
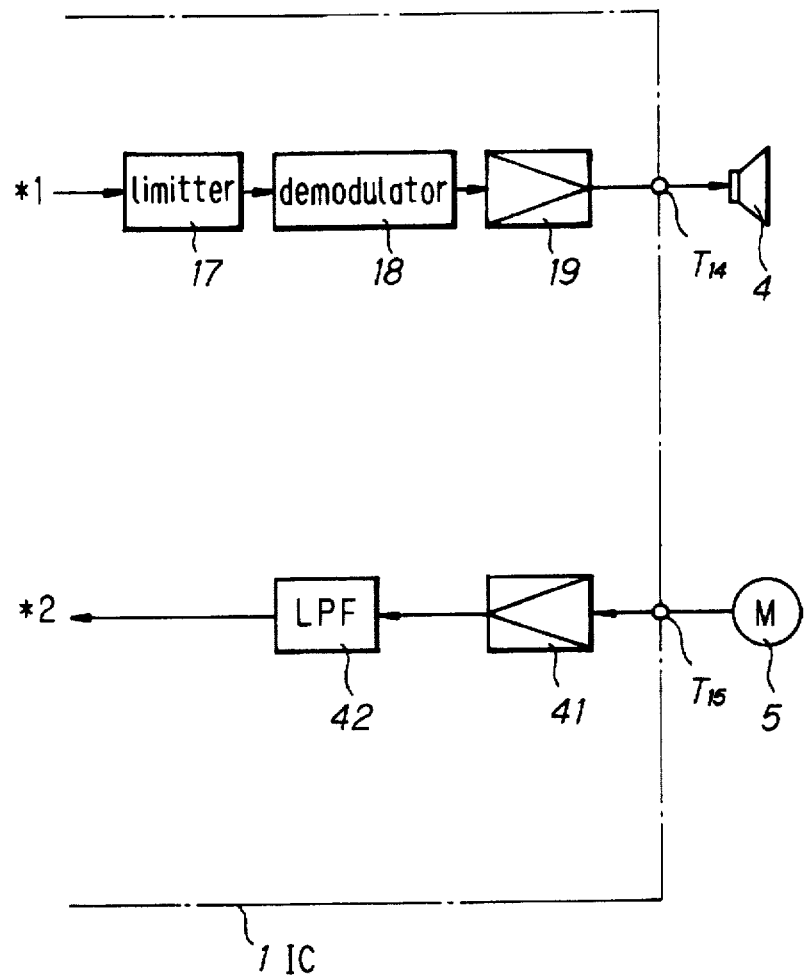
FIG. 2 is a block diagram showing the structure of the remaining part of the embodiment of the present invention.

The receiver 10 and the transmitter 40 shown in FIG. 1 and 2 can therefore be put in their entirety into an integrated circuit on a single monolithic IC.

The case was described in the above where the IC 1 was used in a portable unit. However, if the terminal T14 and terminal T15 are connected to the 4 line/2 line switching circuit of the base unit, and the dividing ratios for the variable dividing circuits 311 and 431 are interchanged, the above operation can be carried out in a base unit. At this time, up channel reception is carried out by the receiver 10 and down channel transmission is carried out by the transmitter 40.

The IC 1 may therefore be used in either a base unit or a portable unit.

Regarding the variable dividing ration of the PLL variable dividing circuit

Generally, in the case of setting the dividing ratio for the variable dividing circuit of the PLL for cordless telephones, a microcomputer or software is used for converting the channel number to a dividing ratio, expressing this dividing ratio in binary form, and then transferring this to the variable dividing circuit.

Further, in the case of Japanese cordless telephones, as shown in FIG. 7, the channel number CHNO is from 1 to 89 with no missing numbers, with the transmission frequencies fBU and fHS(and dividing ratios NBU and NHS) being at fixed frequency intervals.

With this point in mind, this invention is constructed in such a manner that when the channel number CHNO is designated, the dividing ratio of the variable dividing circuits 311 and 431 are set to be values corresponding to this channel number CHNO and in particular, the structure of the dividing ratio setting circuit 36 carrying out this setting can be dramatically simplified.

Namely, the simplification is explained as follows. The relationship between the dividing ratio NBU and the channel number CHNO with regards to the PLL of the transmitter for the cordless telephone base unit is obtained as $$NBU=30416+CHNO$$

where 30416 is the offset value

Then, expressing this as digits in hexadecimal form, we obtain $$NBU=76D0(hex)+CHNO$$

where (hex) shows that this numerical value is expressed in hexadecimal form (as below).

Therefore, in the case of the first channel (CHNO=1), $$30417=30416+1$$

and expressed as digits in hexadecimal, $$76D1(hex)=76D0(hex)+1.$$

The above digits become as shown in FIG. 6A when expressed in binary.

Similarly, in the case of channel 89 (CHNO=89)

$$30505=30416+89,$$

which, expressed as hexadecimal, becomes $$7729(hex)=76D0(hex)+59(hex).$$

Further, these digits become as shown in FIG. 6B if expressed in binary form.

As becomes clear from FIG. 6A and B, when the dividing ratio NBU is expressed in binary form, (1) the upper six bits (binary digits) b15 to b10 do not change, regardless of the channel number CHNO (upper six bits of offset value), (2) the middle five bits b9 to b5 are the sum of the middle five bits of the offset value 76D0 (hex) b9 to b5 and the upper three bits b7 to b5 of the channel number CHNO, and (3) the lower four bits b4 to b1 are equal to the lower four bits b4 to b1 of the channel number CHNO.

Therefore, in the case of setting the dividing ratio NBU at the variable dividing circuit for the PLL of the base unit transmitter, if (A) the upper six bits b15 to b10 are of a fixed value, (B) the middle five bits b9 to b5 are taken as the sum in the aforementioned (2), and (C) the lower four bits b4 to b1 are taken as the lower four bits b4 to b1 of the channel number CHNO, then the dividing ratio NBU can be set just by inputting the channel number CHNO.

Similarly, also regarding the variable dividing circuit 431 for the PLL 43 for the transmitter 40 of the portable unit, the relationship between the dividing ratio NHS and the channel number CHNO becomes;

$$NHS=20308+CHNO$$

where 20308 is the offset value.

If this is expressed in hexadecimal, then $$NHS=4F54(hex)+CHNO.$$

Therefore, in the case of the first channel (CHNO=1), $$20309=20308+1$$

which, expressed as hexadecimal, becomes $$4F55(hex)=4F54(hex)+1.$$

Further, in binary form this is as shown in FIG. 6C.

Similarly, in the case of the eighty-ninth channel (CHNO=89), then $$20397=20308+89$$

and in hexadecimal form this becomes $$4FAD(hex)=4F54(hex)+59(hex).$$

Further, this becomes as shown in FIG. 6D when expressed in binary form.

Then, as becomes clear from FIG. 6C and FIG. 6D, when the dividing ratio NHS is expressed in binary form, then (4) the upper seven bits b15 to b9 do not change regardless of the channel number CHNO (upper seven bits of offset value), (5) the middle six bits b8 to b3 are the sum of the middle six bits b8 to b3 of the offset value 4F54 (hex) and the upper five bits b7 to b3 of the channel number CHNO, and (6) the lower two bits b2 and b1 are equal to the lower two bits b2 and b1 of the channel number CHNO.

Therefore, in the case of setting the dividing ratio NHS at the variable dividing circuit 431 of the PLL 43 of the transmitter 40 for the portable unit, if (D) the upper seven bits b15 to b9 are taken as fixed values, (E) the middle six bits b8 to b3 are taken as the sum of item (5), and (F) the lower two bits b2 and b1 are taken as the lower two bits b2 and b1 of the channel number CHNO, then the dividing ratio NBU can be set just by inputting the channel number CHNO.

Another approach is also possible regarding the variable dividing circuit 431 of the PLL 43 for the transmitter 40 of the portable unit. FIG. 6C' and FIG. 6D' are basically the same as FIG. 6C and FIG. 6D. However, just the way of partitioning the bits is different, i.e. in FIG. 6C' and FIG. 6D', (7) the upper seven bits b15 to b9 do not change regardless of the channel number CHNO (the upper seven bits of the offset value), (8) the middle four bits b8 to b5 are the sum of the middle four bits b8 to b5 of the offset value 4F54 (hex) and the upper three bits b7 to b5 of the channel number CHNO, and (9) the lower four bits b4 to b1 are the sum of the lower four bits b4 to b1 of the offset value 4F54 (hex) and the lower four bits b4 to b1 of the channel number CHNO (of these, b2 and b1 are equal to the lower two bits b2 and b1 of the channel number CHNO).

Therefore, as in the case of the aforementioned example, (G) the upper seven bits b15 to b9 are taken to be a fixed value, (H) the middle four bits b8 to b5 are taken as the sum in the item (8), and (I) the lower four bits b4 to b1 are taken as the sum in the item (9) (where b2 and b1 are equivalent to the lower two bits b2 and b1 of the channel number CHNO). Here, (7) to (9) and (G) to (I) give the impression of not being logical when compared with (4) to (6) and (D) to (F) mentioned previously, but this has advantages when manufacturing actual products, as is described later.

In this invention, the dividing ratio for the variable dividing circuit of the PLL is set in accordance the aforementioned way of thinking.

Structure of dividing ratio setting circuit

Next, a description will be given of the specific example of the dividing ratio setting circuit 36.

In the example in FIG. 1 and FIG. 2, the IC is used in a portable unit. However, the frequencies (angular frequencies) of the oscillated signal S31 and the phase-shifted signal S32 as the first locally oscillated signals of the receiver 10 are equal to the receiving frequency ωo of the received signal Sr. This receiving frequency ωo is also the transmission signal frequency for the base unit.

Therefore, when the dividing ratio of the PLL 31 for the receiver 10 is set, this dividing ratio is equal to the dividing ratio NBU at the time of setting the transmission frequency fBU at the base unit. The dividing ratio for the variable dividing circuit 311 of the PLL 31 can therefore be set using the same method as is used for setting the dividing ratio NBU for the PLL of the transmitter for the base unit described using FIG. 6A and FIG. 6B.

In the following example, the dividing ratio is set for the variable dividing circuit 311 of the PLL 31 for the receiver 10 and the variable dividing circuit 431 of the PLL 43 for the transmitter 40.

Figure 4:
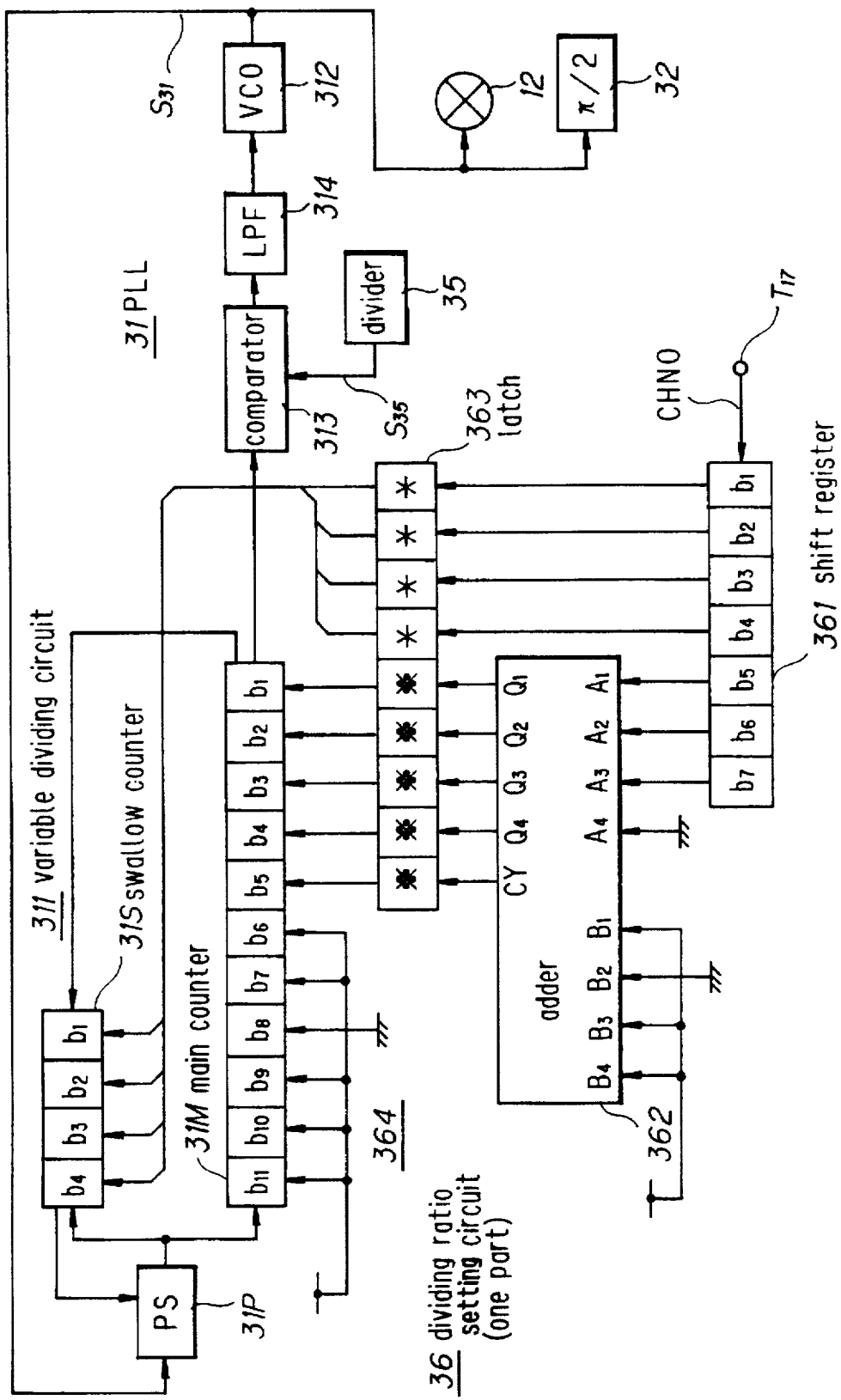
FIG. 4 is a block diagram showing part of an example of the dividing ratio setting circuit
Figure 5A:
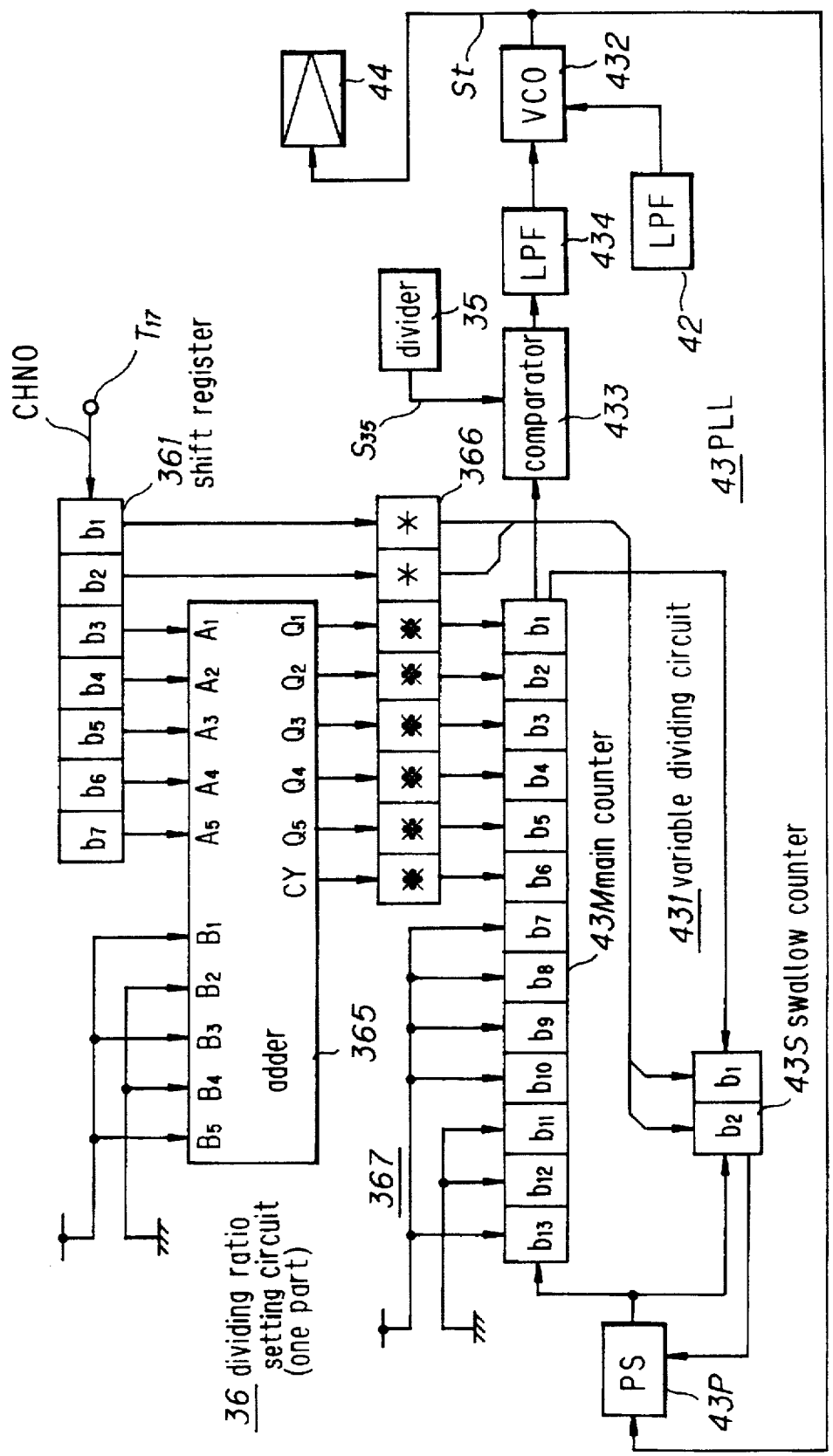
FIG. 5A and FIG. 5B are block diagrams showing further parts of the example of the dividing ratio setting circuit.
Figure 5B:
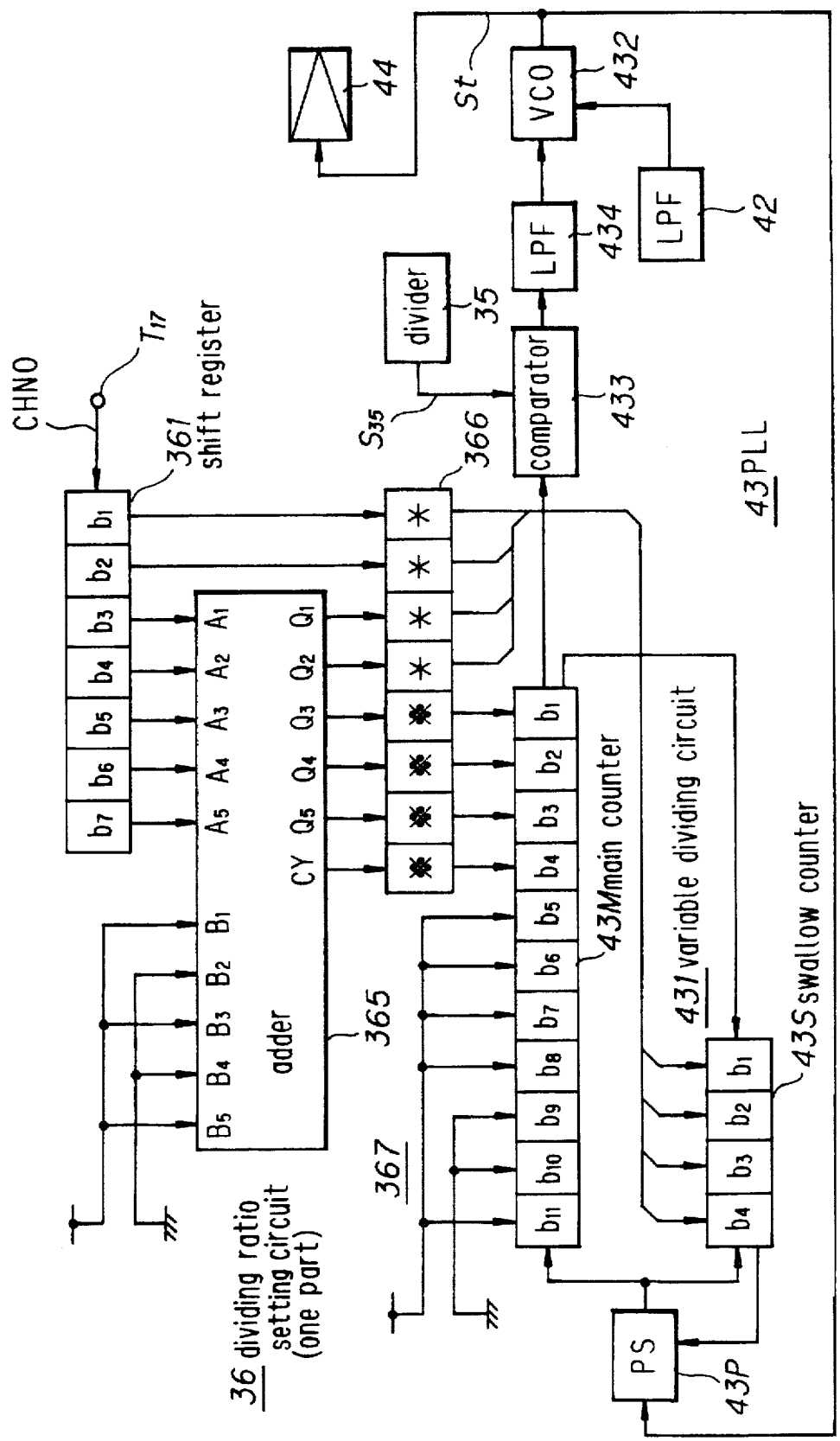

FIG. 4, FIG. 5A and FIG. 5B show an example of the dividing ratio setting circuit 36 which is divided up between FIG. 4 and FIG. 5 with some parts of the circuit being shown in both drawings for convenience.

In the example in FIG. 4, the variable dividing circuit 311 of the PLL 31 is constructed using a pulse swallow type counter having a pre-scaler 31P, a main counter 31M and a swallow counter 31S.

In this case, the pre-scaler 31P divides the frequency by k or (k+1) using control signals (modulo control signals) from the swallow counter 31S. The dividing ratio k for the pre-scaler 31P then becomes $2^{Ns}$ when the bit number for the swallow counter is taken to be Ns. The output of the pre-scaler 31P is provided to the main counter 31M and the swallow counter 31S. Further, the main counter 31M is constructed as an 11 bit downcounter to carry out the dividing. When the value due to the downcounting becomes "0", the decode output is then provided to the swallow counter 31S as a reset input. This swallow counter 31S is constructed from a 4 bit downcounter, so that k=16.

Therefore, if:

N31=total dividing ratio for the variable dividing circuit 311 and N31=NBU,

K=dividing ratio for pre-scaler 31P,

M=dividing ratio for the main counter 31M,

S=dividing ratio for the swallow counter 31S, then, $$N31 = (K+1) \times S + K \times (M-S)$$
$$= M \times K + S$$
$$= M \times 16 + S.$$

The total dividing ratio can therefore be provided by installing the upper eleven bits b15 to b5 of the dividing ratio N31 in the main counter 31M and the lower four bits b4 to b1 of the dividing ratio N31 in the swallow counter 31S.

The dividing output of the counter 31M is provided to a phase comparator circuit 313 and the signal S35 for the reference frequency (=12.5 kHz) from the dividing circuit 35 is provided to the phase comparator circuit 313, with the comparator output being provided to the VCO 312 as a control signal via a low-pass filter 314. Further, the oscillated signal S31 from the VCO 312 is provided to the pre-scaler 31P.

In this way, the PLL 31 is constructed and the oscillated signal S31 of a frequency corresponding to the dividing ratio N31 is taken from the VCO 312. This oscillated signal S31 is then provided to the first mixer 12 and the phase-shifting circuit 32.

Further, a seven bit serial input/parallel output shift register 361 is provided at the dividing ratio setting circuit 36, along with a four-bit addition circuit 362, a nine-bit latch 363 and a signal line 364 that correspond to the PLL 31.

Binary data representing the channel number CHNO is outputted from a microcomputer (not shown in the drawings) serially from the MSB (bit b7). This data is provided serially to the shift register 361 via the terminal T17 and loaded.

The lower four bits of data b1 to b4 of the shift register 361 are provided to the bits b4 to b1 of the swallow counter 31S after having been latched without modification to the lower 4 bits (shown by *) of the latch 363 in accordance with the aforementioned items (3) and (c).

A "0" level signal and the upper three bits b7 to b5 of data from the shift register 361 are provided to the first input terminals A4 to A1 of the addition circuit 362, with a "1" or "0" being provided at second input terminals B4 to B1 of the addition circuit 362 and the addition then being carried out in accordance with the aforementioned items (2) and (B).

The addition results (including the carry bit) are then provided to the lower five bits b5 to b1 of the main counter 31M after having been latched at the upper five bits (shown by ✳) of the latch 363.

Further, a "1" or "0" level signal is provided to the upper six bits b11 to b6 of the main counter 31M from the signal line 364 in accordance with the aforementioned items (1) and (A).

The dividing ratio N31 corresponding to the channel number CHNO is then loaded at the variable dividing circuit 311 when the data for the channel number CHNO is loaded at the shift register 361, with the oscillating frequency of the oscillated signal S31 of the VCO 312 then becoming a frequency corresponding to the channel number CHNO.

The dividing ratio is actually calculated as follows.

From the above, the dividing ratio N for the swallow counter can be expressed by $$N=KM+S+tm \quad (*)$$

Therefore, from FIG. 6A, when CHNO=1,

K=16,

M=11101101101 (binary number)=1901 (decimal number),

S=0001 (binary number)=1 (decimal number)

In this way, N=30417 is obtained (same value as for FIG. 7B).

From FIG. 6B, when CHNO=89,

K=16

M=11101110010 (binary number)=1906 (decimal number)

S=1011 (binary number)=9 (decimal number).

In this way, N=30505 is obtained (the same value as for FIG. 7B).

In FIG. 5A, the PLL 43 has the same construction as the PLL 31, i.e. a pulse swallow type variable dividing circuit 431 comprises a pre-scaler 43P, a main counter 43M and a swallow counter 43S, with the PLL 43 then comprising a phase comparator 433, a low-pass filter 434 and the VCO 432. An audio signal from the low-pass filter 42 is also provided to the VCO 432 as a modulation signal.

Further, corresponding to the PLL 43, a five-bit addition circuit 365, an eight-bit latch 366 and a signal line 367 are provided at the dividing ratio setting circuit 36.

The lower two bits of data b2 and b1 of the shift register 361 (data for the channel number CHNO) are provided to the two bits b1 and b2 of the swallow counter 43S after having been latched at the lower two bits (indicated by *) of the latch 366 without modification in accordance with the aforementioned items (6) and (F).

Moreover, the five upper bits of data b7 to b3 of the register 361 are provided to the first input terminals A5 to A1 of the addition circuit 365 and a "1" or "0" level signal is provided to the second input terminals B5 to B1 of the addition circuit 365, with addition then being carried out in accordance with the aforementioned items (5) and (E).

The addition results (including the carry bit) are latched at the middle six bits (shown by ✳) of the latch 366, with the latched six bits being provided to the lower six bits b6 to b1 of the main counter 43M.

Further, a "1" or "0" level signal is provided to the upper seven bits b13 to b7 of the counter 43M from the signal line 367 in accordance with the aforementioned items (4) and (D).

The dividing ratio NHS corresponding to the channel number CHNO is loaded at the variable dividing circuit 431 when data for the channel number CHNO is loaded at the shift register 361. The carrier frequency of the oscillated signal St of the VCO 432 then becomes a frequency corresponding to the channel number CHNO.

The dividing ratio is actually calculated as follows.

Because the swallow counter bit number is 2, then K=4.

From the equation (*), the dividing ratio N for the swallow counter can be expressed by

N=KM+S

Therefore, from FIG. 6C, when CHNO=1,

K=4,

M=1001111010101 (binary number)=5077 (decimal number),

S=01 (binary number)=1 (decimal number).

In this way, N=20309 is obtained (same value as for FIG. 7B).

From FIG. 6D, when CHNO=89,

K=4

M=1001111101011 (binary number)=5099 (decimal number)

S=01 (binary number)=1 (decimal number).

In this way, N=20397 is obtained (the same value as for FIG. 7B).

In FIG. 5B, the PLL 43 has the same construction as the PLL 31, i.e. the pulse swallow type variable dividing circuit 431 comprises the pre-scaler 43P, the main counter 43M and the swallow counter 43S, with the PLL 43 then comprising a phase comparator 433, the low-pass filter 434 and a VCO 432. An audio signal from the low-pass filter 42 is also provided to the VCO 432 as a modulation signal.

Further, corresponding to the PLL 43, the five-bit addition circuit 365, the eight-bit latch 366 and the signal line 367 are provided at the dividing ratio setting circuit 36.

In accordance with the aforementioned items (9) and (I), the lower two bits b2 and b1 and the upper two bits b4 and b3 of data of the shift register 361 (data for the channel number CHNO) are provided to the swallow counter 43S after having been latched at the lower 4 bits (indicated by *) of the latch 366, with the lower b2 and b1 being latched without modification and the upper b3 and b4 being latched after being added by the adder.

Moreover, the five upper bits of data b7 to b3 of the register 361 are provided to the first input terminals A5 to A1 of the addition circuit 365 and a "1" or "0" level signal is provided to the second input terminals B5 to B1 of the addition circuit 365, with addition then being carried out in accordance with the aforementioned items (8) and (H).

The addition results (including the carrier bit) are latched at the middle 4 bits (shown by *) of the latch 366 and provided to the lower 4 bits b4 to b1 of the main counter 43M.

Further, a "1" or "0" level signal is provided to the upper 7 bits b13 to b7 of the counter 43M from the signal line 367 in accordance with the aforementioned items (7) and (G).

The dividing ratio NHS corresponding to the channel number CHNO is loaded at the variable dividing circuit 431 when data for the channel number CHNO is loaded at the shift register 361. The carrier frequency of the oscillated signal St of the VCO 432 then becomes a frequency corresponding to the channel number CHNO.

By comparing FIG. 5A and FIG. 5B, it can be seen that the bit numbers for the swallow counter 43S and the main counter 43M are different. Further, in FIG. 4 and FIG. 5B, the swallow counters and the main counters have the same bit number.

Namely, by adopting both of the circuits of FIG. 4 and FIG. 5B, it is possible to use the same two swallow counters and main counters for both. This has the benefit of reducing costs because parts are used in common.

The equivalence of FIG. 5A and FIG. 5B will be evident by actually calculating a dividing ratio.

From equation (*), the dividing ratio N for the swallow counter can be expressed by $$N=KM+S.$$

Therefore, from FIG. 6C, when CHNO=1,

K=16,

M=10011110101 (binary number)=1269 (decimal number),

S=0101 (binary number)=5 (decimal number)

In this way, N=20309 is obtained (same value as for FIG. 7B).

From FIG. 6B, when CHNO=89,

K=16

M=10011111010 (binary number)=1274 (decimal number)

S=1101 (binary number)=13 (decimal number).

In this way, N=20397 is obtained (the same value as for FIG. 7B).

According to this dividing ratio setting circuit 36, the dividing ratios N31 and NHS of two variable dividing circuits 311 and 431 can be set to the values corresponding to their respective channels by providing data indicating the channel number CHNO to the dividing ratio setting circuit 36 only once.

No software processing is therefore necessary for obtaining the dividing ratio N31 of the PLL43 of the receiver 10 and the dividing ratio NHS of the PLL 43 for the transmitter 40 from the channel number CHNO when the microcomputer sets the channels and the load on the microcomputer and software is reduced.

As becomes clear from the drawings, the scale of the circuit for the dividing ratio setting circuit 36 can be made small because this dividing ratio setting circuit 36 can be comprised just of a shift register 361, addition circuits 362 and 365 and latches 363 and 366.

In the above, the case has been given for the application of this invention in a cordless telephone and associated PLL. However, this invention can be applied to any transmitting and receiving equipment and associated PLLs for which the usable frequencies and the frequency intervals are fixed.

The addition circuit 365 (and 362) can be made to be a subtraction circuit when the direction of change of the channel number CHNO is opposite to the direction of change of the transmitting frequency (and receiving frequency). Further, addition circuits 362 or 365 can be provided between the latches 363 or 366 and the counters 311 or 431.

According to this invention, data for the channel dividing ratio can be outputted merely by designating the channel number while the structure for achieving this can be kept extremely simple and the circuit scale can be kept small.

What is claimed is:

1. A counter apparatus for setting a dividing ratio based on a sum of a fixed value and a variable value, comprising:

an upper-digits-setting circuit for setting a first plurality of upper digits of a series of digits representing said dividing ratio to a respective plurality of upper fixed digits representing a plurality of upper digits of a series of digits representing said fixed value;

a middle-digits-setting circuit for setting a plurality of middle digits of said series of digits representing said dividing ratio to middle fixed digits of said series of digits representing said fixed value;

an adder for adding said plurality of middle fixed digits and a plurality of variable digits representing a second plurality of upper digits of a series of digits representing said variable value and providing an output to set a plurality of variable middle digits of said series of digits representing said dividing ratio; and a lower-digits-setting circuit for setting a plurality of lower digits of said series of digits representing said dividing ratio to lower variable digits representing a plurality of lower digits of said series of digits representing said variable value.

2. A counter apparatus according to claim 1, wherein said counter apparatus further comprises:
   a first counter for setting said plurality of fixed upper digits and said plurality of fixed middle digits; and
   a second counter for setting said lower variable digits.

3. A counter apparatus according to claim 2, wherein said second counter for setting said lower variable digits is a swallow counter.

4. A counter apparatus according to claim 1, wherein said counter apparatus further comprises:
   a first counter for setting said plurality of fixed upper digits and a part of said plurality of fixed middle digits; and
   a second counter for setting a remaining part of said plurality of fixed middle digits and said plurality of lower digits of said series of digits representing said dividing ratio.

5. A counter apparatus according to claim 4, wherein said second counter for setting the remaining part of said plurality of fixed middle digits and said plurality of lower digits is a swallow counter.

6. A method of setting a dividing ratio based on a sum of a fixed value and a variable value in a counter, comprising the steps of:
   setting upper digits of a series of digits representing said dividing ratio to upper fixed digits, said upper digits representing upper digits of a series of digits representing said fixed value;
   setting a sum of fixed digits representing middle digits of said series of digits representing said fixed value and variable digits representing upper digits of a series of digits representing said variable value to middle digits of said series of digits representing said dividing ratio; and
   setting lower digits of said series of digits representing said dividing ratio to lower variable digits representing lower digits of said series of digits representing said variable value.

7. A phase-locked-loop oscillating circuit, comprising:
   an oscillator for generating an oscillated signal;
   a variable divider for dividing a frequency of said oscillated signal by a variable dividing ratio based on a sum of a fixed value and a variable value; and
   comparing means for comparing an output signal of said variable divider with a reference oscillated signal having a reference frequency and controlling the frequency of said oscillated signal so that the frequency of said output signal of said variable divider becomes equal to said reference frequency,
   said variable divider including:
      memory means for memorizing said variable value as data for varying a frequency of oscillation;
      an upper-digits-setting circuit for setting a first plurality of upper digits of a series of digits representing said dividing ratio to a respective plurality of upper fixed digits representing a plurality of upper digits of a series of digits representing said fixed value;
      a middle-digits-setting circuit for setting a plurality of middle digits of said series of digits representing said dividing ratio to middle fixed digits of said series of digits representing said fixed value;
      an adder for adding said plurality of middle fixed digits and a plurality of variable digits representing a second plurality of upper digits of a series of digits representing said variable value and providing an output to set a plurality of variable middle digits of said series of digits representing said dividing ratio; and
      a lower-digits-setting circuit for setting a plurality of lower digits of said series of digits representing said dividing ratio to lower variable digits representing a plurality of lower digits of said series of digits representing said variable value.

8. A receiver apparatus comprising:
   a phase-locked-loop oscillating circuit; and
   a frequency converting circuit for converting frequencies of input signals by mixing said input signals with an output signal of said phase-locked-loop oscillating circuit provided as a local oscillator,
   said phase-locked-loop oscillating circuit including:
      an oscillator for generating an oscillated signal;
      a variable divider for dividing a frequency of said oscillated signal by a variable dividing ratio based on a sum of a fixed value and a variable value; and
      comparing means for comparing an output signal of said variable divider with a reference oscillated signal having a reference frequency and controlling the frequency of said oscillated signal so that the frequency of said output signal of said variable divider becomes equal to said reference frequency,
   said variable divider including:
      memory means for memorizing said variable value as data for varying a frequency of oscillation;
      an upper-digits-setting circuit for setting a first plurality of upper digits of a series of digits representing said variable dividing ratio to a respective plurality of upper fixed digits representing a plurality of upper digits of a series of digits representing said fixed value;
      a middle-digits-setting circuit for setting a plurality of middle digits of said series of digits representing said dividing ratio to middle fixed digits of said series of digits representing said fixed value;
      an adder for adding said plurality of middle fixed digits and a second plurality of variable digits representing a plurality of upper digits of a series of digits representing said variable value and providing an output to set a second plurality of variable middle digits of said series of digits representing said variable dividing ratio; and
      a lower-digits-setting circuit for setting a plurality of lower digits of said series of digits representing said dividing ratio to lower variable digits representing a plurality of lower digits of said series of digits representing said variable value.

9. A transmitter apparatus comprising:
   a phase-locked-loop oscillating circuit; and
   an amplifier for amplifying an output signal of said phase-locked-loop oscillating circuit,
   said phase-locked-loop oscillating circuit including:
      an oscillator for generating an oscillated signal;
      a variable divider for dividing a frequency of said oscillated signal by a variable dividing ratio based on a sum of a fixed value and a variable value; and
      comparing means for comparing an output signal of said variable divider with a reference oscillated signal having a reference frequency and controlling the frequency of said oscillated signal so that the frequency of said output signal of said variable divider becomes equal to said reference frequency, said variable divider including:
  memory means for memorizing said variable value as data for varying a frequency of oscillation;
  an upper-digits-setting circuit for setting a first plurality of upper digits of a series of digits representing said dividing ratio to a respective plurality of upper fixed digits representing a plurality of upper digits of a series of digits representing said fixed value;
  a middle-digits-setting circuit for setting a plurality of middle digits of said series of digits representing said dividing ratio to middle fixed digits of said series of digits representing said fixed value;
  an adder for adding said plurality of middle fixed digits and a plurality of variable digits representing a second plurality of upper digits of a series of digits representing said variable value and providing an output to set a plurality of variable middle digits of said series of digits representing said dividing ratio; and
  a lower-digits-setting circuit for setting a plurality of lower digits of said series of digits representing said dividing ratio to lower variable digits representing a plurality of lower digits of said series of digits representing said variable value.

10. A transceiver apparatus comprising:
a first phase-locked-loop oscillating circuit; and
a second phase-locked-loop oscillating circuit,
said first phase-locked-loop oscillating circuit including:
  a first oscillator for generating a first oscillated signal;
  a first variable divider for dividing a frequency of said first oscillated signal by a first variable dividing ratio based on a sum of a first fixed value and a first variable value; and
  first comparing means for comparing an output signal of said first variable divider with a reference oscillated signal having a reference frequency and controlling the frequency of said first oscillated signal so that the frequency of said output signal of said first variable divider becomes equal to said reference frequency,
said first variable divider including:
  first memory means for memorizing said first variable value as data for varying a frequency of oscillation;
  a first upper-digits-setting circuit for setting a first plurality of upper digits of a series of digits representing said first, variable dividing ratio to a respective plurality of upper fixed digits representing a plurality of upper digits of a series of digits representing said first fixed value;
  a first middle-digit-setting circuit for setting a plurality of middle digits of said series of digits representing said dividing ratio to middle fixed digital of said series of digits representing said fixed value;
  a first adder for adding said plurality of middle fixed digits and a plurality of variable digits representing a second plurality of upper digits of a series of digits representing said first variable value and providing an output to set a plurality of variable middle digits of said series of digits representing said first variable dividing ratio; and
  a first lower-digits-setting circuit for setting a plurality of lower digits of said series of digits representing said first dividing ratio to lower variable digits representing a plurality of lower digits of said series of digits representing said first variable value;
said second phase-locked-loop oscillating circuit including:
  a second oscillator for generating a second oscillated signal;
  a second variable divider for dividing a frequency of said second oscillated signal by a second variable dividing ratio based on a sum of a second fixed value and a second variable value; and
  second comparing means for comparing an output signal of said second variable divider with a reference oscillated signal having a reference frequency and controlling the frequency of said second oscillated signal so that the frequency of said output signal of said second variable divider becomes equal to said reference frequency,
said second variable divider including:
  a second memory means for memorizing said second variable value as data for varying a frequency of oscillation;
  a second upper-digits-setting circuit for setting a first plurality of upper digits of a series of digits representing said second variable dividing ratio to a respective plurality of upper fixed digits representing a plurality of upper digits of a series of digits representing said second fixed value;
  a second middle-digits-setting circuit for setting a plurality of middle digits of said series of digits representing said dividing ratio to middle fixed digits of said series of digits representing said fixed value;
  a second adder for adding said plurality of middle fixed digits and a plurality of variable digits representing a second plurality of upper digits of a series of digits representing said second variable value and providing an output to set a plurality of variable middle digits of said series of digits representing said second variable dividing ratio; and
  a second lower-digits-setting circuit for setting a plurality of lower digits of said series of digits representing said second dividing ratio to lower variable digits representing a plurality of lower digits of said series of digits representing said second variable value.

11. A transceiver apparatus according to claim 10, wherein each of said first and second phase-locked-loop oscillating circuits further comprises:
  a first counter for setting said plurality of fixed upper digits and said plurality of fixed middle digits; and
  a second counter for setting said lower fixed digits.

12. A transceiver apparatus according to claim 11, wherein each of said second counters for setting said lower fixed digits is a swallow counter.

13. A transceiver apparatus according to claim 11, wherein a number of digits of each of said first counters for setting said plurality of fixed upper digits and said plurality of fixed middle digits is equal in said first and second phase-locked-loop oscillating circuits.

14. A transceiver apparatus according to claim 12, wherein a number of digits of each of said swallow counters is equal in said first and second phase-locked-loop oscillating circuits.

15. A transceiver apparatus according to claim 10, wherein each of said first and second phase-locked-loop oscillating circuits further comprises:
  a first counter for setting said first plurality of fixed upper digits and a part of said plurality of fixed middle digits; and
  a second counter for setting a remaining part of said plurality of fixed middle digits and said plurality of lower digits of said series of digits representing said dividing ratio.

16. A transceiver apparatus according to claim 15, wherein said second counter for setting the remaining part of said plurality of fixed middle digits and said plurality of lower digits is a swallow counter.

17. A transceiver apparatus according to claim 15, wherein a number of digits of each of said first counters for setting said first plurality of fixed upper digits and a part of said middle fixed digits is equal in said first and second phase-locked-loop oscillating circuits.

18. A transceiver apparatus according to claim 16, wherein a number of digits of each of said swallow counters is equal in said first and second phase-locked-loop oscillating circuits.

* * * * *